(12) United States Patent
Reig et al.

(10) Patent No.: US 9,934,922 B2
(45) Date of Patent: Apr. 3, 2018

(54) COMMUTATOR STRUCTURE COMPRISING SEVERAL CHANNELS OF PHASE CHANGE MATERIAL AND INTERDIGITATED CONTROL ELECTRODES

(71) Applicant: Commissariat a l'Energie Atomique et aux Energies Alternatives, Paris (FR)

(72) Inventors: Bruno Reig, Moirans (FR); Alexandre Leon, Sassenage (FR); Gabriele Navarro, Grenoble (FR); Vincent Puyal, Grenoble (FR); Damien Saint-Patrice, Chabeuil (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/444,629

(22) Filed: Feb. 28, 2017

(65) Prior Publication Data

US 2017/0256377 A1 Sep. 7, 2017

(30) Foreign Application Priority Data

Mar. 2, 2016 (FR) ...................................... 16 51778

(51) Int. Cl.
*H01H 37/32* (2006.01)
*H01H 37/34* (2006.01)
(Continued)

(52) U.S. Cl.
CPC ............ *H01H 37/72* (2013.01); *H01H 37/34* (2013.01); *H01L 45/08* (2013.01);
(Continued)

(58) Field of Classification Search
CPC . H01L 45/08; H01L 45/1206; H01L 45/1226; H01L 45/1286; H01L 45/144; H01L 45/16; H01H 37/72; H01H 37/34
(Continued)

(56) References Cited

U.S. PATENT DOCUMENTS 3,448,302 A * 6/1969 Shanefield ......... G11C 13/0004
257/1
4,352,083 A * 9/1982 Middleman ............ H01C 7/027
219/505

(Continued)

FOREIGN PATENT DOCUMENTS

WO WO 2007/041431 A1 4/2007
WO WO 2009/001262 A1 12/2008

OTHER PUBLICATIONS

U.S. Appl. No. 15/101,825, filed Jun. 3, 2016, Damien Saint-Patrice et al.

(Continued)

*Primary Examiner* — Anatoly Vortman
(74) *Attorney, Agent, or Firm* — Oblon, McClelland, Maier & Neustadt, L.L.P.

(57) ABSTRACT

RF commutator including:
a phase change material (7) arranged between a first conducting element (2) and a second conducting element (4),
means of heating (11, 13) the phase change material provided with a first electrode (11) and a second electrode (13), the means of heating being capable of modifying the state of the phase change material (7) by injection of an electrical activation signal between the first electrode and the second electrode, at least one given electrode (11, 13) among the first electrode (11) and second electrode (13) comprising a conducting part (15a) arranged between the first conducting element (2)
(Continued)

and the second conducting element (4), zones of the phase change material being laid out between the first conducting element (2) and the second conducting element (4) and being arranged on either side of this conducting part (15a).

17 Claims, 4 Drawing Sheets

(51) Int. Cl.
*H01H 37/72* (2006.01)
*H01L 45/00* (2006.01)

(52) U.S. Cl.
CPC ...... *H01L 45/1206* (2013.01); *H01L 45/1226* (2013.01); *H01L 45/1286* (2013.01); *H01L 45/144* (2013.01); *H01L 45/16* (2013.01)

(58) Field of Classification Search
USPC ........................................................ 337/298
See application file for complete search history.

(56) References Cited

U.S. PATENT DOCUMENTS

| | | | | |
|---|---|---|---|---|
| 5,614,881 | A * | 3/1997 | Duggal | H01C 7/027 338/20 |
| 5,894,255 | A | 4/1999 | Wallintin | |
| 5,963,121 | A * | 10/1999 | Stygar | H01C 7/028 252/511 |
| 6,404,665 | B1 * | 6/2002 | Lowrey | G11C 13/0004 257/3 |
| 6,903,362 | B2 * | 6/2005 | Wyeth | H01P 1/10 257/3 |
| 7,420,445 | B2 * | 9/2008 | Wyeth | H01P 1/10 333/101 |
| 7,436,692 | B2 * | 10/2008 | Pellizzer | H01L 27/2463 257/E27.004 |
| 8,174,877 | B2 * | 5/2012 | Baks | G11C 13/0004 257/E21.004 |
| 8,759,808 | B2 * | 6/2014 | Nodin | H01L 45/06 257/1 |
| 2007/0099405 | A1 | 5/2007 | Oliva et al. | |
| 2008/0029753 | A1 | 2/2008 | Xu et al. | |
| 2011/0012082 | A1 * | 1/2011 | Tio Castro | H01L 45/06 257/2 |
| 2014/0191181 | A1 | 7/2014 | Moon | |
| 2014/0266517 | A1 * | 9/2014 | Werner | H01P 1/10 333/262 |
| 2016/0003573 | A1 | 1/2016 | Johnston | |

OTHER PUBLICATIONS

U.S. Appl. No. 15/101,839, filed Jun. 3, 2016, Damien Saint-Patrice et al.
U.S. Appl. No. 15/385,209, filed Dec. 20, 2016, Bruno Reig et al.
Nabil El-Hinnawy et al. "A Four-Terminal, Inline, Chalcogenide Phase-Change RF Switch Using an Independent Resistive Heater for Thermal Actuation", IEEE Electron Device Letters, vol. 34, No. 10, 2013, 3 pages.
Arnaud Vena et al." a fully Passive RF Switch Based on Nanometric Conductive Bridge", 2012 IEEE, 2012, 3 pages.
Muzhi Wang et al. "Directly Heated Four-Terminal Phase Change Switches", 2014 IEEE, 2014, 4 pages.
Anand Gopinath et al. " GaAs FET RF Switches", IEEE Transactions on Electron Devices, vol.Ed-32, No. 7, 1985, 7 pages.
Aurelian Crunteanu et al. "Microwave Switching Functions Using Reversible Metal-Insulator Transition (MIT) in VO$_2$Thin Films", Proceedings of the 37$^{th}$European Microwave Conference, 2007, 4 pages.
Yonghyun Shim et al. " RF Switches using Phase Change Materials", MEMS 2013, 4 pages.

* cited by examiner

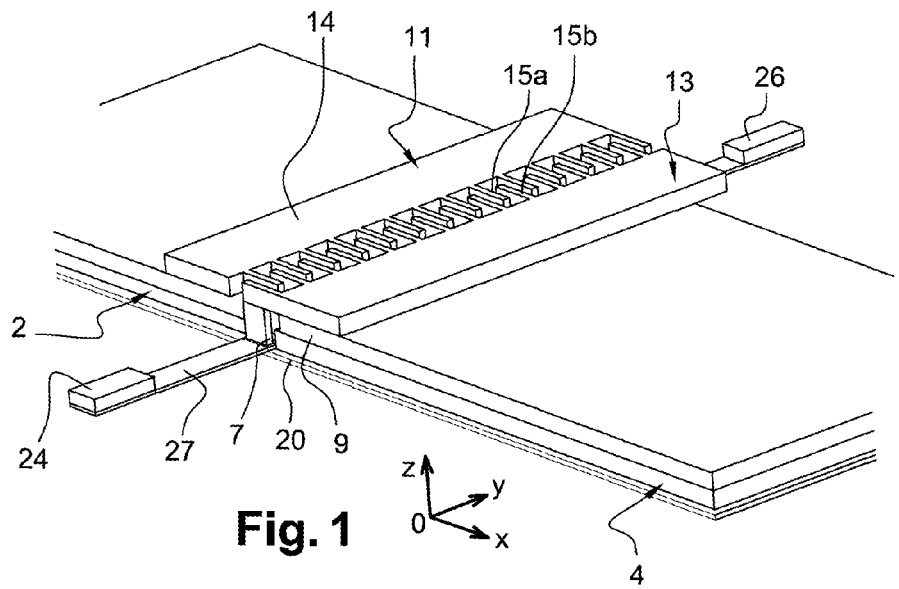
Fig. 1
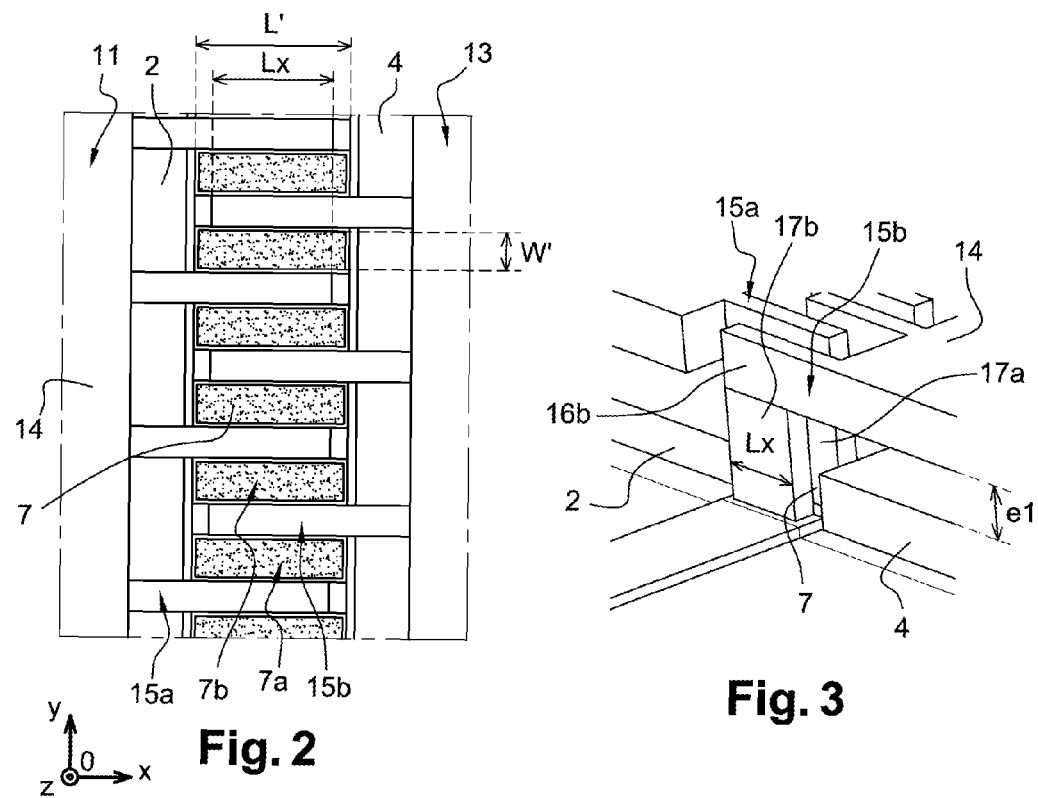
Fig. 2
Fig. 3

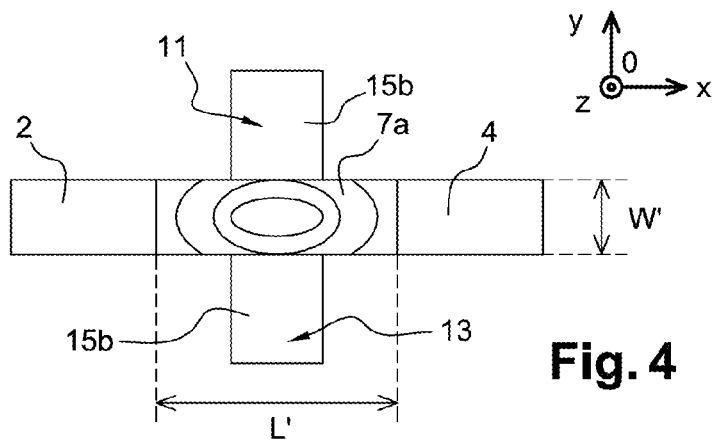
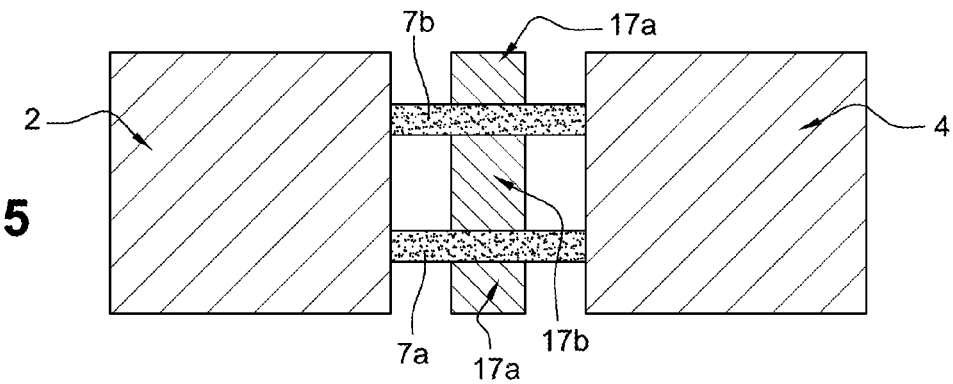
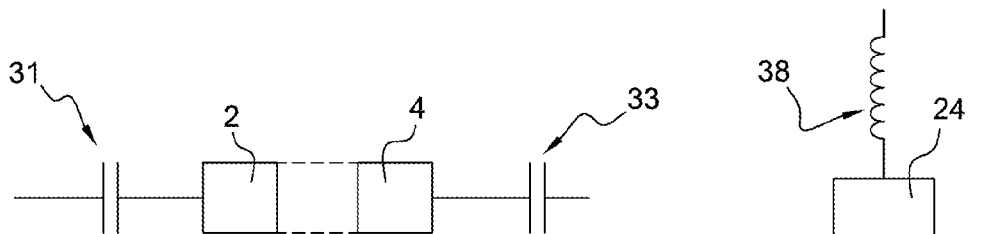
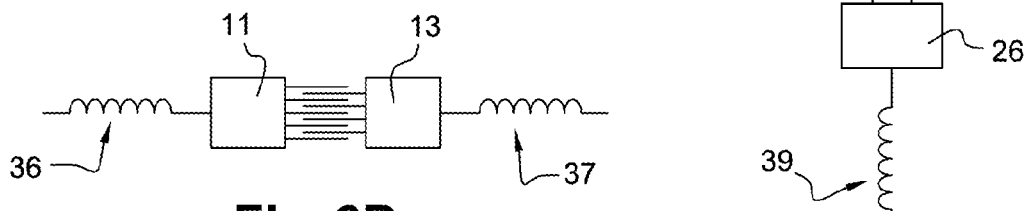

COMMUTATOR STRUCTURE COMPRISING SEVERAL CHANNELS OF PHASE CHANGE MATERIAL AND INTERDIGITATED CONTROL ELECTRODES

TECHNICAL FIELD AND PRIOR ART

The present application relates to the field of commutators integrating a phase change material, in particular those made of thin layers and which can form part of an integrated circuit or an electronic device. The present invention notably applies to RF commutators, that is to say to structures intended to modify in a reversible manner the electrical connections between elements of a RF circuit.

RF commutators are normally made from electronic components such as FET (Field Effect Transistors) or PIN (Positive Intrinsic Negative) diodes or by means of electro-mechanical relays of MEMS (Micro Electro Mechanical System) type.

RF commutators integrating a phase change material (PCM) have also appeared.

The operation of a RF commutator based on PCM is typically founded on two states that said PCM is capable of adopting:
- a high resistivity amorphous state, which is assimilated with an "OFF" state of the commutator, during which the transmission of a RF signal is prevented between at least two terminals,
- a low resistivity crystalline state, which constitutes an "ON" state of the commutator, during which the transmission of the RF signal is enabled between the two terminals.

Since the two states are stable, it is not necessary to maintain a current/voltage to maintain a state, which enables a power saving compared to other technologies such as FET or PIN diode based commutators.

Furthermore, a commutator provided with a PCM makes it possible to convey higher power signals compared to those normally conveyed by MEMS commutators.

The document US 2014/0266517 A1 provides an example of switch provided with a PCM inserted between an input conducting line and an output conducting line through which a RF signal is intended to transit.

The change of phase of the PCM is obtained by making a current pulse pass in dedicated control electrodes arranged in direct contact with the PCM or instead at a distance therefrom.

With such a type of device, it can prove to be difficult to obtain a homogeneous change of phase of the PCM over its whole surface, especially since to obtain good insulation in the "OFF" state and low resistance in the "ON" state it is not generally possible to reduce the PCM surface too considerably.

When an incomplete crystallisation or amorphisation of the PCM occurs, the "OFF" and "ON" states of the switch are poorly defined. More generally, the inhomogeneity of change of phase may lead to a degradation of the performances of the switch or even a failure of the latter.

DESCRIPTION OF THE INVENTION

An embodiment of the present invention relates to a device capable of establishing or breaking a connection between a first conducting element and a second conducting element resting on a support, said device including:
at least one phase change material arranged between the first conducting element and the second conducting element, the phase change material being capable of changing state between a crystalline state wherein the phase change material has a first resistivity and an amorphous state wherein the phase change material has a second resistivity higher than the first resistivity, in such a way that when the phase change material is in the crystalline state it enables the routing of a first signal between the first conducting element and the second conducting element, when the phase change material is in the amorphous state it prevents the routing of the first signal between the first conducting element and the second conducting element,
means of heating the phase change material provided with at least one first electrode and at least one second electrode, the means of heating being capable of modifying the state of the phase change material by injection of at least one electrical activation signal to the first electrode and/or the second electrode, at least one given electrode among said first electrode and second electrode comprising at least one conducting portion part arranged between the first conducting element and the second conducting element, zones of the phase change material being laid out between the first conducting element and the second conducting element and being arranged on either side of this conducting portion.

Another embodiment of the present invention relates to a device capable of routing or interrupting a connection between at least one first conducting element and at least one second conducting element resting on a support, said device including:
at least one phase change material arranged between the first conducting element and the second conducting element, the phase change material being capable of changing state between a crystalline state wherein the phase change material has a first resistivity and an amorphous state wherein the phase change material has a second resistivity higher than the first resistivity, in such a way that when the phase change material is in the crystalline state it enables the routing of a first signal between the first conducting element and the second conducting element, when the phase change material is in the amorphous state it prevents the routing of the first signal between the first conducting element and the second conducting element,
means of heating the phase change material provided with at least one first electrode and at least one second electrode, the means of heating being capable of modifying the state of the phase change material by Joule effect by injecting at least one electrical activation signal between the first electrode and the second electrode,
the device comprising, between the first conducting element and the second conducting element:
at least one first zone of phase change material and at least one second zone of phase change material, the first zone of phase change material and the second zone of phase change material being arranged on either side and in contact with a conducting portion of a given electrode among said first electrode and second electrode, the first zone of phase change material being intercalated between said conducting portion of the given electrode and a conducting portion of another electrode among said first electrode and second electrode, the second zone of phase change material being intercalated between said conducting portion of the given electrode and a conducting portion of another electrode among said first electrode and second electrode.

Routing of the first signal between the first conducting element and the second conducting element is taken to mean from the first conducting element to the second conducting element or from the second conducting element to the first conducting element.

With such a layout of the phase change material with respect to the conducting part of the given electrode of the means of heating, and in particular a distribution of the phase change material (PCM) in several distinct zones or plots, it is possible to make the change of state of this material more homogeneous, and in particular to homogenise the amorphisation of this material.

The change of phase of these plots of PCM is controlled by electrodes dissociated from the conducting elements intended to route the first signal.

The phase change material may thus be arranged according to at least two zones of PCM distributed against the electrodes of the means of heating and oriented along the direction of transmission of the signal between the conducting elements.

A parallelisation of the plots or zones of phase change material makes it possible to have a low resistance in the "ON" state.

The device may be a RF commutator or a RF bistable switch.

The electrical activation signal may in particular be in the form of at least one current pulse applied to one of the electrodes and intended to traverse the phase change material.

Advantageously, the first conducting element and the second conducting element may be arranged in a same first plane. Such a configuration makes it possible to be able potentially to separate the first conducting element and the second conducting element by a considerable distance in order to reduce the capacitance between the first conducting element and the second conducting element and also to obtain better insulation. The production of the first conducting element and the second conducting element in a same plane ("in-line" structure) makes it possible to obtain better blocking of the first signal in the "OFF" state than with a stacked structure.

Said conducting portions may be laid out orthogonally to the main plane of the support. Thus, the activation signal of the PCM is capable of circulating in a direction orthogonal to the direction of routing of the first signal between the conducting elements. Such a layout of the first electrode and/or the second electrode makes it possible to arrange the electrodes of the means of heating in a plane different to that in which lie the first conducting element and the second conducting element, which makes it possible notably to be able to reduce the risks of coupling between electrodes and conducting elements dedicated to the routing of the first signal.

The electrodes may be provided with a plurality of conducting tracks each formed of a vertical conducting portion and of a horizontal conducting zone.

Advantageously, the first electrode comprises several first conducting tracks whereas the second electrode comprises several second conducting tracks, the first conducting tracks and the second conducting tracks being interdigitated. Advantageously, the first electrode comprises a plurality of vertical conducting portions and the second electrode comprises a plurality of vertical conducting portions, the vertical conducting portions of the first electrode and the vertical conducting portions of the second electrode being interdigitated.

This makes it possible to further improve the homogenisation of the state of the phase change material. A structure of electrodes with several conducting tracks also make it possible to provide PCM zones having an aspect ratio (length/width) favourable to complete change of phase, in particular during amorphisation.

According to a possible embodiment, said zones of the phase change material are provided situated on either side of the conducting part with a length L' and a width W' such that L'/W' is greater than 1 and preferably greater than 3. Such an aspect ratio is favourable to the complete change of state of the phase change material.

The first electrode and the second electrode may be in contact with said zones of phase change material and thus form a means of direct heating the phase change material.

According to a possible embodiment, the heating means may further include at least one additional heating means.

This additional heating means may be a means of indirect heating the phase change material configured to heat the phase change material by heat radiation.

The means of indirect heating may include a resistance connected to at least one additional electrode through which another electrical activation signal is intended to be applied. The control, by a means of indirect heating, of the passage from the amorphous state to the crystalline state by a remote resistance makes it possible to have a uniform crystallisation over the considerable combined widths of PCM. This makes it possible to optimise the transmission of the first signal in the "ON" state of the device.

The other electrical activation signal may be a current injected in particular in the form of at least one pulse typically of lower amplitude than that injected to the given electrode of the means of direct heating.

Advantageously, the additional electrode may be arranged in the first plane. This notably makes it possible to define the patterns of electrode of the means of direct heating at the same time as the conducting elements.

According to a possible embodiment, the means of heating may be provided to alternatively:
  inject said electrical activation signal to the given electrode so as to make the phase change material change from a crystalline state to an amorphous state,
  inject said other electrical activation signal to the additional electrode so as to make the phase change material change from an amorphous state to a crystalline state. In this case, the amorphisation of the PCM, which requires a high temperature, is realised by direct heating and the crystallisation, which requires less power, is realised by indirect heating. The DC power consumption is thus reduced compared to known structures using uniquely indirect heating.

In a variant, the means of heating may be configured to inject the electrical activation signal to the given electrode and concomitantly inject the other activation signal to the additional electrode.

To prevent coupling between the electrodes and the conducting elements and to avoid the activation signal being transmitted to the conducting elements, the first conducting element and/or the second conducting element may be connected to a means of decoupling, such as a decoupling capacitor.

To avoid the first signal being transmitted to the electrodes, the first electrode and/or the second electrode may be connected to a means of decoupling, such as a decoupling inductance.

To avoid the first signal being transmitted to an additional electrode of the means of indirect heating, this additional electrode may be connected to a means of decoupling, such as a decoupling inductance.

According to an embodiment, the device may comprise zones of different phase change materials between the first conducting element and the second conducting element.

BRIEF DESCRIPTION OF THE DRAWINGS

The present invention will be better understood on reading the description of exemplary embodiments given by way of example and in no way limiting, and by referring to the appended drawings in which:

FIG. 1 serves to illustrate an example of RF commutator or RF switch device implemented according to an embodiment of the present invention provided with an integrated PCM, the device being represented according to a perspective view;

FIG. 2 gives a top view of the device;

FIG. 3 gives an enlarged view of conducting portions of electrodes serving to heat the PCM material;

FIG. 4 gives a top view of a plot of PCM;

FIG. 5 gives a simplified schematic top view of plots of PCM intercalated between portions of electrodes of means of heating the PCM;

FIGS. 6A-6C serve to illustrate different examples of decoupling means to enable decoupling between, on the one hand, the signal or signals for controlling the switch or commutator and, on the other hand, the signal intended to be transmitted by this commutator or switch;

Figure 7A:
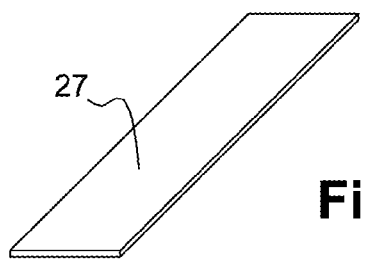
FIGS. 7A-7F serve to illustrate an example of method for manufacturing the commutator or switch device.
Figure 7B:
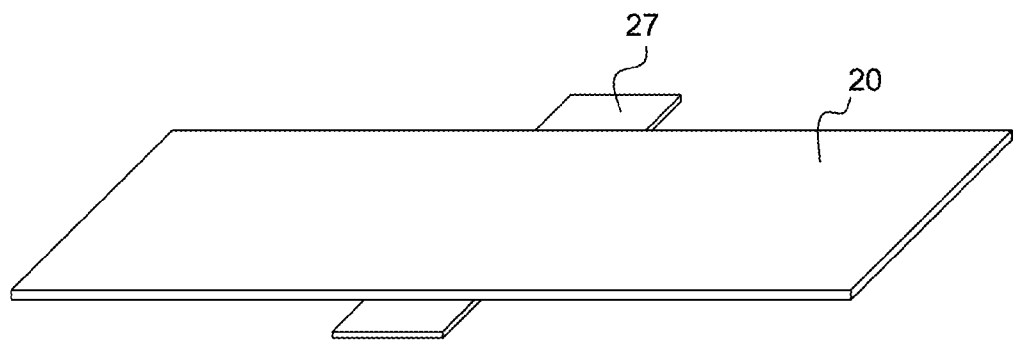

Moreover, in the following description, terms that depend on the orientation of the device apply by considering that the structure is oriented in the manner illustrated in the figures.

Identical, similar or equivalent parts of the different figures bear the same numerical references so as to make it easier to go from one figure to the next.

The different parts represented in the figures are not necessarily according to a uniform scale, in order to make the figures more legible.

DETAILED DESCRIPTION OF PARTICULAR EMBODIMENTS

Reference will firstly be made to FIGS. 1, 2, 3 illustrating, in a schematic manner (respectively according to a perspective view, a top view, and an enlarged region of the perspective view), an example of device according to an embodiment of the present invention.

This device is a commutator making it possible to modify the connections of at least one circuit (not represented) which, in this exemplary embodiment, is intended to convey radio frequency (RF) signals. The commutator is thus a RF commutator capable of enabling or interrupting the routing of at least one RF signal between a first portion of circuit and a second portion of circuit, as a function of the state of at least one phase change material (PCM) laid out between these two portions. The device described here may fulfil the function of a bistable switch. Nevertheless, the term "commutator" will be used throughout the present detailed description.

The conveyed RF signal has a frequency that may be comprised for example between several megahertz and several hundreds of gigahertz and a power for example of the order of 40 dBm.

The commutator thus comprises a first conducting element 2 through which at least one RF signal is intended to enter and which is connected with the first portion of the RF circuit and a second conducting element 4 connected with the second portion of the RF circuit and through which the RF signal is thus intended to exit. The first conducting element 2 and the second conducting element 4 thus form two terminations of a RF electrical signal transmission line, these two terminations being separated from each other by a phase change material 7 and being electrically connected to, and advantageously in contact with, this phase change material 7. The first conducting element 2 and the second conducting element 4 may be for example based on a metal material such as aluminium (Al), copper (Cu), gold (Au), titanium (Ti), or tungsten (W) or a doped semi-conductor material such as for example doped silicon, or a conductive polymer such as PEDOT (3,4-ethylene dioxy thiophene), or a metal oxide such as ruthenium oxide ($RuO_2$) or iridium oxide ($IrO_2$), or a transparent conductor material such as for example ITO (indium oxide doped with tin).

The first conducting element 2 and the second conducting element 4 are here for example in the form of flat conducting zones which extend on a support, and in particular parallel to the main plane of this support. "Main plane" of the support is taken to mean a plane passing through the support and which is parallel to the plane [0; x; y] of the orthogonal reference system [0; x; y; z] indicated in FIGS. 1 and 2.

The support may be a substrate, in particular a semiconductor substrate, for example based on silicon, potentially coated with a passivation layer made of silicon oxide ($SiO_2$). In a variant, the support of the commutator may be a microelectronic device, in particular an insulating layer of this device. It is also possible to provide as support an insulating layer for example of IMD (intermetal dielectric layer) type and which is situated between two levels of interconnections of electronic components or instead an insulating layer belonging to one of the final levels commonly known as the "back-end" of an integrated circuit.

The commutator is capable of adopting a first so-called "ON" state wherein the first conducting element 2 and the second conducting element 4 are connected to each other such that at least one RF signal can transit from the first conducting element 2 to the second conducting element 4. The commutator is also capable of adopting a second so-called "OFF" state wherein between the first conducting element 2 and the second conducting element 4, the transmission of a RF signal between the first conducting element 2 and the second conducting element 4 is prevented.

The "ON" (conducting) and "OFF" (non-conducting) states of the commutator correspond to different states of the phase change material 7. The phase change material 7 may be in particular a material capable of going from an amorphous state to a crystalline state and vice versa as a function of the temperature to which it is taken. Thus, this phase change material 7, intercalated between the conducting elements 2, 4, is capable, when it is in amorphous form, of adopting a state of high resistivity and, when it is in crystalline form, of adopting a state of low resistivity. "Low resistivity" is taken to mean a resistivity that may be comprised for example between $10^{-4}$ ohm·cm and $10^{-2}$ ohm·cm. "High resistivity" is taken to mean a resistivity that may be comprised for example between 10 ohm·cm to 1000 ohm·cm.

When the phase change material 7 is in its lowly resistive crystalline state, the RF signal is transmitted from the first conducting element 2 to the second conducting element 4, whereas when the phase change material 7 is in its highly resistive amorphous state, the RF signal is reflected and is thus not transmitted to the second conducting element 4. By changing the state of the material between its amorphous state and its crystalline state, it is thus possible to obtain a switch function.

The phase change material 7 may be for example based on a chalcogenide or an alloy of chalcogenides such as $Ge_2Sb_2Te_5$ or GeTe. Such materials advantageously have a high resistivity ratio, for example of the order of $10^3$ and which may reach $10^6$ between their low resistivity state and their high resistivity state.

To make the phase change material 7 change from a crystalline state to an amorphous state and vice versa, the device is provided with means of activating the PCM 7, these means here being means of heating, preferably of electrical type.

To make the phase change material 7 change from a crystalline state to an amorphous state of the PCM 7, said PCM is heated to a temperature situated in a first range of temperatures, in particular high temperatures for a first duration, typically short.

The first range of temperatures may be comprised between for example 600° C. and 1000° C., applied for a duration comprised between 10 ns to 100 ns in particular when the phase change material 7 is for example $Ge_{50}Te_{50}$ or $Ge_{30}Te_{70}$ or $Ge_2Sb_2Te_5$. The temperatures of this first range may thus be situated above the melting temperature $T_F$ of the phase change material, which is for example of the order of 725° C. for GeTe.

To make the phase change material 7 change from an amorphous state to a crystalline state of the PCM 7, said PCM is heated to a temperature situated in a second range of temperatures, in particular temperatures lower than the first range, for a first duration typically longer than the amorphisation durations. It may thus be placed at another temperature situated in a second range of temperatures, lower than the first range, to recover its crystalline state. The temperatures of this second range are typically higher than the crystallisation temperature of the PCM 7 (for example of the order of 190° C. for GeTe) and lower than the melting temperature $T_F$ of this phase change material (for example of the order of 725° C. for GeTe). When the PCM 7 is GeTe, it can return to a crystalline state by being heated to a temperature comprised typically between 150° C. and 250° C. The closer the temperature is to the melting temperature, the faster recrystallization will take place. The use of a GeTe type material with a very high growth rate may guarantee a rapid recrystallization rate. Typically, the duration to return from the amorphous state to the crystalline state is longer than that to change from the crystalline state to the amorphous state, for example between 1 μs and 10 ms. The temperatures applied and respective durations of application depend on the phase change material 7 that has been chosen.

To heat the PCM 7 and make it change state, it is possible to provide a means of direct heating configured to inject an electrical activation signal, for example in the form of current, in the PCM 7 which is then heated by Joule effect. The means of direct heating is provided with electrodes 11, 13 between which the PCM 7 is arranged.

When a suitable current pulse passes between the two electrodes 11 and 13 through the PCM 7, said PCM goes from a crystalline state to a highly resistive amorphous state. The passage of a RF signal is blocked between the first conducting element 2 and the second conducting element 4. To make the PCM 7 change from its amorphous state to its crystalline state, another suitable current pulse is applied between the two electrodes 11, 13 through the PCM 7.

The current pulse may have an intensity between several hundreds of micro-amperes and several tens of mA depending on the quantity of PCM. It is possible for example to provide pulses of the order of 1 mA and of a duration of the order of 10 μs to carry out crystallisation whereas, to carry out amorphisation, the current pulses have a higher intensity, for example of the order of 10 mA and a shorter duration, for example of the order of 50 ns.

The RF signal is then made to pass between the first conducting element 2 and the second conducting element 4. The electrical activation signal (for example a current) applied to make the PCM 7 change from a crystalline state to an amorphous state is provided with an amplitude (intensity) greater than that of the signal applied to make the PCM 7 change from an amorphous state to a crystalline state.

The electrodes 11, 13 may have for example a comb shape and include flat conducting zones 14, for example of rectangular shape, to which are attached end conducting tracks 15a, 15b that form the teeth of the comb. The end conducting tracks 15a of the first electrode 11 extend in the direction of the second electrode 13, whereas the end conducting tracks 15b of the second electrode 13 extend in the direction of the first electrode 11. The conducting tracks of each of the electrodes may be parallel with each other and interdigitated with those of the other electrode.

The electrodes 11, 13 of the means of direct heating are preferably dissociated from the conducting elements 2, 4 through which the RF signal transits. The pair of conducting elements 2, 4 may thus be insulated from that of electrodes 11, 13 by means of at least one intermediate dielectric layer 9, for example based on silicon nitride of thickness $e_1$ (measured parallel to the z axis of the orthogonal reference system [0; x; y; z]) for example of the order of 100 nm. Such a layout makes it possible to better dissociate the path of RF signals from that of a DC current between the electrodes 11, 13. It is thus possible to avoid the creation of an electrical path between conducting elements 2, 4 and electrodes 11, 13 of direct heating when the change of state of the PCM 7 is activated.

In this exemplary embodiment, the end conducting tracks 15a, 15b are formed of horizontal zones 16a (for the first electrode), 16b (for the second electrode), the horizontal conducting zones 16a of the first electrode 11 extending to the second electrode 13, whereas the horizontal conducting zones 16b of the second electrode 13 extend to the first electrode 11.

In the exemplary embodiment of FIGS. 1 and 2, the electrodes 11, 13 are not arranged at the same level as the conducting elements 2, 4. The phase change material 7 is for its part situated at the same level as the conducting elements 2, 4 conveying the RF signal, whereas the electrodes 11, 13 are placed above the conducting elements 2, 4.

To enable a contact between the electrodes 11, 13 of the means of direct heating (situated above the conducting elements 2, 4) and the phase change material 7, the end conducting tracks 15a, 15b are provided with vertical conducting portions 17a (for the first electrode 11) and 17b (for the second electrode 13), each vertical conducting portion 17a (resp. 17b) being situated in the extension of a horizontal conducting zone 16a (resp. 16b).

The vertical conducting portions 17a or 17b extend typically orthogonally to the support, in other words parallel to the z axis of the reference [0; x; y; z], and are in contact with the zones of PCM over a length Lx shorter than the length L' of the zones of PCM (the lengths Lx and L' being measured parallel to the x axis of the orthogonal reference system [0; x; y; z]).

In order to be able to better control the changes of state of the PCM 7 and to ensure a more homogenous change of state of the phase change material 7, in particular to be able to obtain a complete amorphous state of the phase change material 7, an improved layout of the electrodes 11, 13 and of the phase change material 7 with respect to each other is provided.

The PCM material 7 is thus spread out in several zones 7a, 7b, also known as "plots", arranged in parallel between the first conducting element 2 through which a RF signal is intended to enter and the second conducting element 4 through which the RF signal is intended to exit. This arrangement in plots or zones 7a, 7b, of PCM makes it possible to have a low resistance to the "ON" state of the commutator.

Preferably, the zones 7a, 7b, or plots 7a, 7b, of PCM 7 are provided with an aspect ratio L'/W' between their length L' and their width W' (measured parallel to the y axis of the orthogonal reference system [0; x; y; z]) greater than 1 and which is advantageously greater than 3, in order to improve the homogeneity of crystallisation and amorphisation by direct heating of the PCM. In the highly resistive amorphous phase, the conductivity may be for example of the order of 1 S/m, which makes it possible to obtain resistances of the order of 100 k$\Omega$ to 1 M$\Omega$ for a zone of PCM of a length L' of the order of 1 µm, a combined width (sum of the widths W') of the plots of the order of ten or so microns and a thickness of the order of one hundred or so nanometers. The conductivity during the crystalline phase is typically of the order of 100 kS/m, which makes it possible to obtain resistances of the order of 1$\Omega$.

The vertical conducting portions 17a, 17b, which extend against the zones 7a, 7b or plots 7a, 7b of PCM, may advantageously be arranged such that a conducting portion 17a of the first electrode 11, and a conducting portion 17b of the second electrode 13, are situated on either side and in contact with a zone or plot of PCM (FIG. 4).

FIG. 5 gives a top view in the plane of the conducting elements 2, 4 of an example of layout of zones or plots 7a, 7b of PCM with respect to vertical conducting portions of heating electrodes 11, 13.

A first zone 7a of phase change material and a second zone 7b of phase change material are arranged on either side of a conducting portion 17b of the second electrode 13, the first zone 7a of phase change material being intercalated between this conducting portion 17b of the second electrode 13 and a conducting portion 17a of the first electrode 11. Similarly, the second zone of phase change material 7b is intercalated between the conducting portion 17b of the second electrode 13 and a conducting portion 17a of the first electrode 11. The conducting tracks 17a, 17b, are here in direct contact with the zones of phase change material.

Thus, in a plane parallel to the main plane of the support and a direction forming a non-zero angle, in particular orthogonal, with the horizontal parts 15a of the conducting tracks 15, the commutator comprises an alternation of conducting tracks 15a, 5b and zones 7a, 7b of phase change material 7. Advantageously, the conducting tracks 15a of the first electrode 11 and the conducting tracks 15b of the second electrode 13 are interdigitated. To change from the crystalline state to the amorphous state, a current is made to pass between the interdigitated comb electrodes 11, 13 directly through the plots of the PCM thanks to the vertical portions 17a, 17b of the conducting tracks 15a, 15b forming the teeth of the combs that are in contact with the plots of PCM.

The layout of the conducting tracks 15a, 15b of the electrodes 11, 13, situated on either side of the zones or plots of PCM 7, makes it possible to ensure better uniformity or homogeneity of the change of phase of the zone of PCM 7, which also makes it possible to have a better definition of the "ON" or "OFF" states of the commutator.

In order to improve the changes of state of the PCM, and in particular to facilitate the passage of the PCM 7 from an amorphous state to a crystalline state, the commutator may also be provided with an additional means of heating, known as means of "indirect" heating, in so far as it is not arranged in direct contact with the phase change material 7.

The means of indirect heating may be provided with additional electrodes 24, 26 arranged on either side of the conducting elements 2, 4 and the electrodes 11, 13. The additional electrodes 24, 26 form terminations of the means of indirect heating used. These two terminations are arranged on a thin layer forming a resistance 27. This resistance 27 may be based on a conducting material having a high resistivity, for example comprised between 100 µ$\Omega$·cm and 1000 µ$\Omega$·cm.

The resistance 27 may be arranged near to the PCM 7 and be electrically insulated from this PCM 7 by dielectric material 20. In the particular exemplary embodiment of FIG. 1, the resistance 27 extends under the phase change material 7.

When a suitable current pulse passes between the two electrodes 24 and 26 through the resistance 27, a thermal radiation generated by Joule effect makes it possible to heat the PCM 7 through the dielectric material 20 and is capable of making the PCM 7 change from its amorphous state to its lowly resistive crystalline state. The current pulse implemented may have an intensity of the order of 10 times that of the pulses produced for direct heating. As for direct heating, the duration of the pulses depends on the state in which it is wished to place the PCM 7, pulses of longer duration being provided to make the PCM amorphous than to make it crystalline. For example, pulses of a duration of 10 ns to 100 ns may be produced for the amorphisation of the PCM, whereas pulses of a duration comprised between 1 µs and 1 ms are going to be implemented for the amorphisation of the PCM 7.

A layout variant provides arranging the resistance 27 directly on the PCM 7 without intermediate insulant.

The means of indirect heating make it possible to produce a homogeneous thermal radiation so as to carry out a homogeneous heating of the phase change material 7. This uniformity of heating thus makes it possible to crystallise all of the zones 7a, 7b or plots of PCM 7 and to have a low total resistance of the PCM 7 to the crystalline state, which may be typically of the order of 1 Ohm.

With a means of indirect heating, the zone of thermal radiation is here defined by the size of the resistance 27 and no longer depends on the distribution of the current density in the PCM, which makes the homogenisation of the change of state easier.

The combined implementation of a means of direct heating and a means of indirect heating makes it possible to reach the desired temperatures in the PCM 7 without having to use too high current densities. Combined implementation is taken to mean that the means of direct or indirect heating may act simultaneously or successively.

Thus, according to a possible embodiment of the means of actuating the PCM 7, it is provided that the triggering of the change from crystalline state to amorphous state of this phase change material 7 is carried out using means of direct heating when a current is injected between the electrodes 11 and 13, whereas the triggering of the change from amorphous state to crystalline state of the phase change material 7 is carried out using means of indirect heating when another current is injected to one of the additional electrodes 24, 26. Compared to a device that would only use one means of indirect heating, in this case the power necessary to attain the amorphous state of the PCM 7 is reduced.

According to another embodiment possibility of the means of actuating the PCM 7, it is provided that the triggering of the change from crystalline state to amorphous state of this phase change material 7 is carried out by concomitant injection of a current from the means of direct heating and of another current in the means of indirect heating, whereas the triggering of the change from amorphous state to crystalline state of the phase change material 7 is also carried out using means of indirect heating and means of direct heating.

To prevent a transmission of control signals from the electrodes 11, 13 to the conducting elements 2, 4 intended to convey a RF signal or to prevent a transmission of RF signal to the electrodes 11, 13, the sources of DC control signals, means of decoupling may be integrated or associated with the commutator.

Thus, it is possible to provide (as is illustrated in FIG. 6A) one or several decoupling capacitors 31, 33 connected in series with the conducting elements 2, 4 and configured to allow the RF signal to pass and to block DC signals from the electrodes 11, 13, 24, 26 of the means of heating and in particular DC signals from the electrodes 11, 13 of the means of direct heating.

In order to block the transmission of the RF signal to the electrodes 11, 13 of the means of direct heating, it is possible to provide one or more coupling inductances 36, 37 in series with the direct heating electrodes 11, 13 (FIG. 6B).

In order to block a transmission of the RF signal to the electrodes 24, 26 of the means of indirect heating, it is also possible to connect one or more inductance(s) 38, 39 respectively in series with these heating electrodes 24,26 (FIG. 6C).

A commutator such as described previously comprises one PCM. It is also possible, in a variant, to integrate several different materials and in particular to provide different PCMs from one plot 7a, 7b, to the other of PCM. It is possible to choose in particular PCMs with different amorphisation temperatures. The means of heating the PCMs may in this case be configured so as to emit a first type of temperature pulse for which all the PCMs are in a crystalline state with a low overall resistance. The means of heating the PCMs may in this case be configured to emit a second type of temperature pulse such that at least one PCM changes from the crystalline state to the amorphous state, whereas at least one other PCM remains in its crystalline state, in order to obtain a first resistance value. The means of heating the PCMs may in this case be configured so as to emit a third type of temperature pulse provided in terms of intensity and duration so as to make all of the PCMs amorphous. It is thus possible to implement a PCM zone forming a variable resistance.

The example of commutator that has been given above serves for the transmission of RF signals. Nevertheless, the present invention can apply to the implementation of other types of commutators used to transmit other types of electrical signals, in particular of DC (continuous), LF (low frequency), mmw (millimetric wave), terahertz type.

An example of method for manufacturing a commutator structure as described previously will now be given in relation with FIGS. 7A-7F.

The starting support for this method may be a substrate, for example made of silicon passivated by a layer of $SiO_2$ (silicon dioxide).

On this support (not represented in FIGS. 7A-7F) it is possible to produce firstly the resistance 27 of the means of indirect heating (FIG. 7A). This resistance 27 may be in the form of a layer of resistive conducting material such as for example titanium nitride (TiN) of thickness for example of the order of 50 nm. The deposition of the resistive conducting material may be carried out for example by PVD (Physical Vapour Deposition) and be followed by the production of a pattern formed for example by photolithography then by chemical etching.

A first layer of dielectric material 20 may then be formed (FIG. 7B) on the resistance 27. This layer may be for example made of silicon nitride (SiN) and have a thickness for example of the order of 100 nm. The deposition may be carried out for example by PECVD (Plasma Enhanced Chemical Vapour Deposition) and be followed by steps of photolithography and etching for example by RIE (Reactive Ion Etching) of at least one pattern.

A layer of phase change material 7 is then deposited, for example GeTe having a thickness typically of the order of 100 nm, in which several patterns are produced in the form of distinct plots or parallel zones 7a, 7b, 7c resting on the layer of dielectric material 20. The parallel zones 7a, 7b, 7c have for example a rectangular shape.

Figure 7C:
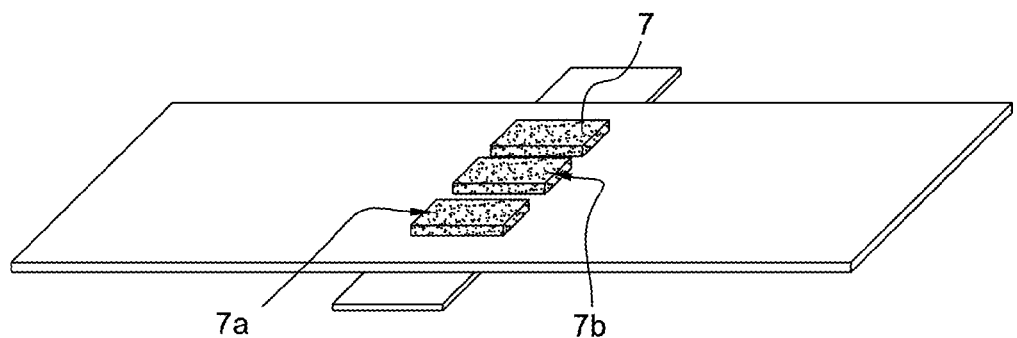

The patterns are produced for example by photolithography then IBE (Ion Beam Etching) or RIE (FIG. 7C).

A stack of electrically conducting material is then deposited for example by PVD. The stack may be formed of a first metal layer for example based on W and of thickness for example of the order of 20 nm covered with a second metal layer, for example based on Au and of thickness of the order of 1 μm.

Figure 7D:
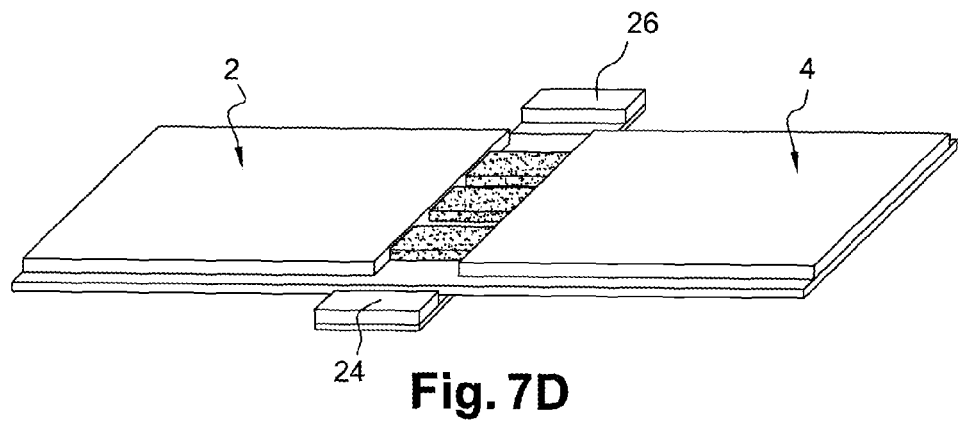

Patterns corresponding to the first conducting element 2 and to the second conducting element 4, through which the RF signal is intended respectively to enter then to exit, are then formed on either side of the zones 7a, 7b, 7c of phase change material 7. In this stack, other patterns corresponding to the electrodes 24, 26 of indirect heating may also be produced by successive chemical etching of the layer of Au and W (FIG. 7D). These other patterns are formed on portions of the stack that rest on the resistance 27 and extend into the holes produced beforehand in the layer of dielectric material 20.

Figure 7E:
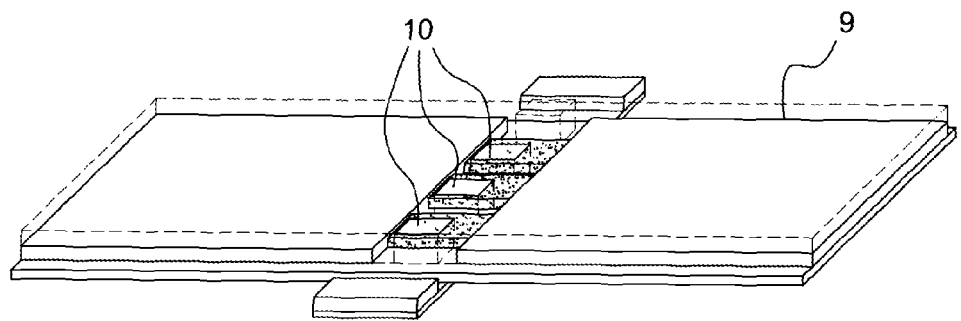

Then, another layer of dielectric material 9 is deposited, for example by PECVD (Plasma Enhanced Chemical Vapour deposition) of 100 nm of SiN (FIG. 7E). Openings 10 are then formed in this other layer of dielectric material 9 between the zones or plots of PCM 7, for example by RIE. This step is carried out by photolithography in such a way that the edges of the openings are in contact with the zones or plots of PCM 7.

A stack of electrically conducting material is then deposited, for example by PVD, so as to fill the openings and cover the layer of dielectric material 9. This stack may be formed of a metal layer for example based on W and of thickness of the order of 20 nm and another metal layer for example based on Au and of the order of 1 μm.

Figure 7F:
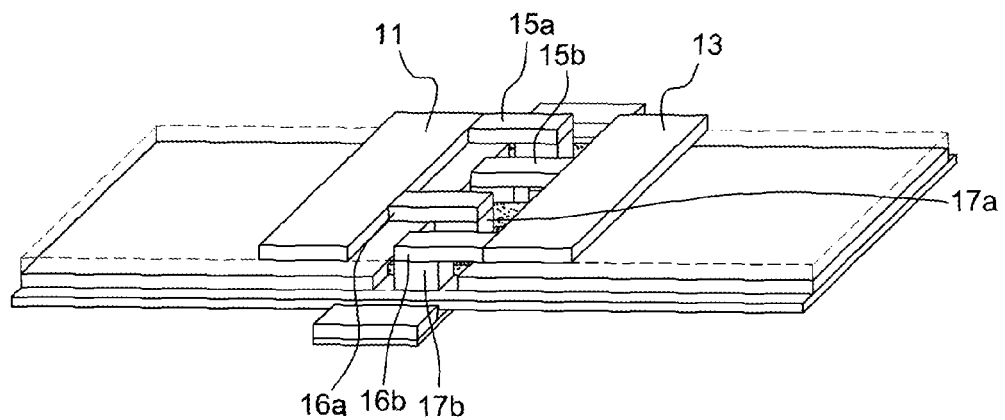

Patterns corresponding to the electrodes 11, 13 of direct heating provided with interdigitated conducting portions 15 are then produced in this stack. These patterns are produced by successive chemical etching of the layers of Au and W (FIG. 7F).

The invention claimed is:

1. Device capable of routing or interrupting a connection between at least one first conducting element and at least one second conducting element resting on a support, said device including:
   at least one phase change material arranged between the first conducting element and the second conducting element, the phase change material being capable of changing state between a crystalline state wherein the phase change material has a first resistivity and an amorphous state wherein the phase change material has a second resistivity higher than the first resistivity, in such a way that when the phase change material is in the crystalline state it enables the routing of a first signal between the first conducting element and the second conducting element, when the phase change material is in the amorphous state it prevents the routing of the first signal between the first conducting element and the second conducting element,
   a heater to heat the phase change material provided with at least one first electrode and at least one second electrode, the heater being capable of modifying the state of the phase change material by Joule effect by injecting at least one electrical activation signal between the first electrode and the second electrode,
   at least one first zone of phase change material and at least one second zone of phase change material being comprised between the first conducting element and the second conducting element, the first zone of phase change material and the second zone of phase change material being arranged on either side and in contact with a conducting portion of a given electrode among said first electrode and second electrode, the first zone of phase change material being intercalated between said conducting portion of the given electrode and a conducting portion of another electrode among said first electrode and second electrode, the second zone of phase change material being intercalated between said conducting portion of the given electrode and a conducting portion of another electrode among said first electrode and second electrode.

2. Device according to claim 1, wherein the first electrode comprises a plurality of conducting portions and the second electrode comprises a plurality of conducting portions, the conducting portions of the first electrode and the conducting portions of the second electrode being interdigitated.

3. Device according to claim 1, wherein said conducting portions are laid out orthogonally to a main plane of the support.

4. Device according to claim 1, wherein the first conducting element and the second conducting element are arranged in a same first plane parallel to a main plane of the support.

5. Device according to claim 1, wherein said conducting portion(s) are connected to a conducting zone arranged in a plane separate from a first plane and parallel to said first plane.

6. Device according to claim 1, wherein the first zone of phase change material and the second zone of phase change material have a length L' measured along an axis passing through the conducting elements and a width W' measured along an axis orthogonal to the conducting elements such that L'/W' is greater than 1 and preferably greater than 3.

7. Device according to claim 1, wherein the first conducting element and/or the second conducting element is electrically connected to a first decoupler between the first signal and the electrical activation signal, such as a decoupling capacitor.

8. Device according to claim 1, wherein the first electrode and/or the second electrode is connected to a second decoupler between the electrical activation signal and the first signal, such as a decoupling inductance.

9. Device according to claim 1, wherein the first electrode and the second electrode are in contact with the phase change material and form a direct heater of the phase change material, the heater further including at least one indirect heater of the phase change material, the indirect heater being configured to heat the phase change material by heat radiation.

10. Device according to claim 9, wherein the first conducting element and the second conducting element are arranged in at least one first plane and wherein the indirect heater includes a resistance connected to at least one additional electrode through which another electrical activation signal is intended to be applied, the additional electrode advantageously being arranged in the first plane.

11. Device according to claim 10, wherein the additional electrode is connected to a decoupler between said other activation signal and the first signal, such as a decoupling inductance.

12. Device according to claim 10, wherein the heater is controlled to alternatively:
   inject the electrical activation signal to the given electrode so as to make at least one zone of phase change material change from a crystalline state to an amorphous state,
   inject the electrical activation signal to the additional electrode so as to make at least one zone of phase change material change from an amorphous state to a crystalline state.

13. Device according to claim 10, wherein the heater include a controller configured to inject the electrical activation signal to the given electrode and concomitantly to inject the other activation signal to the additional electrode.

14. Device according to claim 1, wherein the phase change material is based on chalcogenide or an alloy of chalcogenides.

15. Device according to claim 1, comprising at least two zones of different phase change materials between the first conducting element and the second conducting element.

16. RF commutator or RF switch formed of a device according to claim 1, the signal capable of being routed between the first conducting element and the second conducting element being a RF signal.

17. Device capable of routing or interrupting a connection between at least one first conducting element and at least one second conducting element resting on a support, said device including:
   at least one phase change material arranged between the first conducting element and the second conducting element, the phase change material being capable of changing state between a crystalline state wherein the phase change material has a first resistivity and an amorphous state wherein the phase change material has a second resistivity higher than the first resistivity, in such a way that when the phase change material is in the crystalline state it enables the routing of a first signal between the first conducting element and the second conducting element, when the phase change material is in the amorphous state it prevents the routing of the first signal between the first conducting element and the second conducting element, means of heating the phase change material provided with at least one first electrode and at least one second electrode, the means of heating being capable of modifying the state of the phase change material by Joule effect by injecting at least one electrical activation signal between the first electrode and the second electrode, at least one first zone of phase change material and at least one second zone of phase change material being comprised between the first conducting element and the second conducting element, the first zone of phase change material and the second zone of phase change material being arranged on either side and in contact with a conducting portion of a given electrode among said first electrode and second electrode, the first zone of phase change material being intercalated between said conducting portion of the given electrode and a conducting portion of another electrode among said first electrode and second electrode, the second zone of phase change material being intercalated between said conducting portion of the given electrode and a conducting portion of another electrode among said first electrode and second electrode.

* * * * *